United States Patent
Oya et al.

(10) Patent No.: US 6,479,349 B1
(45) Date of Patent: Nov. 12, 2002

(54) LASER TRANSCEIVER SYSTEM CONTROLLER

(75) Inventors: Toshiharu Oya; Kazumi Kurooka, both of Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/636,464

(22) Filed: Aug. 11, 2000

Related U.S. Application Data

(63) Continuation of application No. 09/085,049, filed on May 27, 1998, now abandoned.

(30) Foreign Application Priority Data

| Jul. 18, 1997 | (JP) | 9-194393 |
| Jul. 23, 1997 | (JP) | 9-197563 |
| Sep. 18, 1997 | (JP) | 9-253592 |

(51) Int. Cl.[7] .......................... H01L 21/336
(52) U.S. Cl. .................. 438/261; 438/301; 438/594
(58) Field of Search ............... 438/261, 301, 438/762, 258, 594

(56) References Cited

U.S. PATENT DOCUMENTS

| 5,029,130 A | 7/1991 | Yeh | |
| 5,045,488 A | 9/1991 | Yeh | |
| 5,067,108 A | 11/1991 | Jenq | |
| 5,219,774 A * | 6/1993 | Vasche | 437/43 |
| 5,496,756 A * | 3/1996 | Sharma et al. | 437/52 |
| 5,591,681 A * | 1/1997 | Wristers et al. | 437/240 |
| 5,674,788 A * | 10/1997 | Wristers et al. | 437/239 |
| 5,726,087 A * | 3/1998 | Tseng et al. | 438/261 |
| 5,936,883 A | 8/1999 | Kurooka et al. | |
| 5,963,806 A | 10/1999 | Sung et al. | |
| 5,989,951 A | 11/1999 | Takahashi | |

FOREIGN PATENT DOCUMENTS

| JP | 8-236647 | 9/1996 |

OTHER PUBLICATIONS

H. Fukuda et al; IEDM Technical Digest, pp. 465–468, 1992.
A. Uchiyama et al; IEDM Technical Digest, pp. 425–428, 1990.
Electronics letters, vol. 26, No. 18, Aug. 30, 1990.

* cited by examiner

*Primary Examiner*—Hoai Ho
*Assistant Examiner*—Thao P Le
(74) *Attorney, Agent, or Firm*—Armstrong, Westerman & Hattori, LLP

(57) ABSTRACT

To provide a method for fabricating a nonvolatile semiconductor memory device in which the occurrence of a trap site formed in a tunnel oxide film can be suppressed so that W/E cycle of a memory cell transistor can be improved. A tunnel oxide film formed between a floating gate 13 and a control gate is constituted by at least one CVD oxide film formed through chemical vapor-phase growth by a low pressure CVD method, and there is provided a step of heating the CVD oxide film in a nitriding atmosphere containing $N_2O$, NO or $NH_3$.

12 Claims, 8 Drawing Sheets

LASER TRANSCEIVER SYSTEM CONTROLLER

This application is a continuation of prior application Ser. No. 09/085,049 filed May 27, 1998 abandoned.

BACKGROUND OF THE INVENTION

1. Field of the Invention

The present invention relates to a nonvolatile semiconductor memory device and a method of fabricating a nonvolatile semiconductor memory device having a floating gate, and a control gate formed so as to overlap the floating gate. More particularly, the present invention relates to a method in which erasing efficiency is prevented from being lowered when data erasing operation is repeated by drawing out electric charges (electrons) accumulated on a floating gate to the control gate side, so that W/E(Writing/Erasig) cycle of memory cells is elongated.

2. Desription of the Related Art

In an electrically erasable nonvolatile semiconductor memory device, especially, programmable ROM (EEPROM: Electrically erasable and programmable ROM), having memory cells each composed of a single transistor, each of the memory cells is formed from a double gate structure transistor having a floating gate, and a control gate. In the case of such a double gate structure memory cell transistor, data writing is performed when hot electrons generated in the drain region side of the floating gate are accelerated and injected into the floating gate. Further, data erasing operation is performed when electric charges are drawn out from the floating gate to the control gate by F-N tunneling (Fowler-Nordheim tunneling).

FIG. 13 is a plan view of a memory cell portion of a nonvolatile semiconductor memory device having a floating gate, and FIG. 14 is a sectional view taken along the X—X line in FIG. 13. These drawings show a split gate structure in which a control gate and a floating gate are disposed side by side.

A plurality of strip-like isolation regions 2 are formed of oxide films (LOCOS) so as to be oxidized selectively thicker than other region in a surface region of a P-type silicon substrate 1, so that a device region is isolated. Each floating gate 4 is disposed on an oxide film 3 so as to bridge adjacent isolation regions 2. The floating gates 4 are disposed independently so that one floating gate 4 corresponds to one memory cell. Further, a selective oxide film 5 on each floating gate 4 is formed thick in the center portion of the floating gate 4 by a selective oxidizing method so that the floating gate 4 has an acute end portion. This fact makes electric field concentration occur easily in the end portion of the floating gate 4 when a data erasing operation is carried out.

On the silicon substrate 1 on which the plurality of floating gates 4 are disposed, control gates 6 are disposed so that one control gate 6 corresponds to one row of floating gates 4. The control gates 6 are disposed so that a part of each control gate 6 overlaps floating gates 4 and the residual part faces the silicon substrate 1 through the oxide film 3. Further, these floating gates 4 and control gates 6 are disposed so that adjacent rows are plane-symmetrical with each other.

N-type drain regions 7 and N-type source regions 8 are formed in a substrate region between the control gates 6 and in a substrate region between the floating gates 4, respectively. The drain regions 7 are surrounded by isolation regions 2 between adjacent control gates 6 so as to be independent of each other. The source regions 8 are formed so as to be continuous in the direction of extension of each control gate 6. A memory cell transistor is constituted by a floating gate 4, a control gate 6, a drain region 7 and a source region 8.

Aluminum wirings 10 are disposed on the oxide film 9 so as to intersect the control gates 6. The aluminum wirings 10 are connected to the drain regions 7 through contact holes 11. Further, the row of control gates 6 serves as a word line, and the row of source regions 8 parallel with the row of control gates 6 serves as a source line. Each of the aluminum wirings 10 connected to the drain regions 7 serves as a bit line.

In the case of such a double gate structure memory cell transistor, the value of "source-drain ON resistance" varies in accordance with the quantity of electric charges injected into the floating gate 4. Therefore, electric charges are injected into the floating gate 4 selectively to make the value of ON resistance of a specific memory cell transistor change so that the difference in operating characteristic of memory cell transistors caused thereby is related to data to be stored.

Incidentally, electrically insulating films 3 for electrically insulating the silicon substrate 1, floating gates 4 and control gates 6 from one another are constituted by three types of silicon oxide films 3a to 3c as shown in FIG. 15. The first silicon oxide film 3a is a gate insulating film formed by thermal oxidation of a surface of the silicon substrate 1. The first silicon oxide film 3a electrically insulates the silicon substrate 1 and the floating gate 4 from each other. Incidentally, the first silicon oxide film 3a is configured so that a predetermined amount of silicon oxide film 3a except the lower surface of the floating gate 4 is removed by etching at the time of patterning of the floating gate 4 for forming the floating gate 4.

Further, the second silicon oxide film 3b is a CVD (chemical vapor deposition) oxide film which is formed through chemical vapor-phase growth by a CVD method so that the floating gate 4 is coated with the second silicon oxide film 3b when the second silicon oxide film 3b is formed on the silicon substrate 1.

Further, the third silicon oxide film 3c is formed in a side wall portion of the floating gate 4 and in a surface of the silicon substrate 1 when the silicon substrate 1 is thermally oxidized after the second silicon oxide film 3b is formed. These first, second and third silicon oxide films 3a to 3c form a three-layer structure for electrically insulating the silicon substrate 1 and the control gate 6 from each other and electrically insulating the floating gate 4 and the control gate 6 from each other. That is, the floating gate 4 is coated with the three-layer structure electrically insulating film 3 to thereby heighten the withstand voltage between the floating gate 4 and the control gate 6 to prevent error in memory cell Writing/Erasing, which is called write/read disturbance.

The above description concerning the related art is disclosed in JP-A-8-236647 filed by the Applicant of this application.

According to the above JP-A-8-236647, a tunnel oxide film (a part of oxide film 3) is optimized so that the number of data rewrites (W/E cycle) by which data Writing/Erasing in a memory cell transistor can be repeated is increased. The tunnel oxide film becomes, however, insufficient to satisfy the recent stronger requirement for W/E cycle.

FIG. 8 shows the results of measurement of W/E cycle in the conventional device having the aforementioned configuration. FIG. 8 shows a state in which the measured memory cell current (axis of ordinate) in an erased memory cell decreases as the number of data rewrites (axis of abscissa) by which data is rewritten increases. As shown in FIG. 8, in the nonvolatile semiconductor memory device fabricated by the conventional process, the number of data rewrites by which rewriting can be repeated before the cell current has decreased to reach a critical judgeable level (for example, about 30% of the initial value 100 $\mu$A of the memory cell current in the erased memory cell: memory cell current 30 $\mu$A) is about 70000. In a general programmable memory, about 100000 is required as the number of data rewrites of repetitions of the data W/E cycle. Accordingly, the number of data rewrites of repetitions of about 70000 is insufficient and it is required to be increased more.

Therefore, the Applicant of this application has aimed at optimizing the configuration of a tunnel oxide film formed between a floating gate and a control gate to attain a further improvement of W/E cycle of a memory cell transistor and has found out the following causal relationship between the film quality of the tunnel oxide film and W/E cycle.

That is, because electric charges (electrons) flown out from the floating gate at the time of erasing operation are accelerated by an electric field generated between the floating gate and the control gate so as to have energy, the electric charges (electrons) cause a trap site easily in the vicinity of the boundary between the second silicon oxide film and the control gate. Accordingly, electrons are trapped in the trap site, so that erasing efficiency is lowered.

SUMMARY OF THE INVENTION

It is therefore an object of the present invention to provide a nonvolatile semiconductor memory device and a method of fabricating thereof, in which the configuration of an electrically insulating film is optimized to suppress the occurrence of the trap site, thereby make it possible to improve W/E cycle of a memory cell transistor greatly.

The present invention is designed to solve the foregoing object and has a feature that a tunnel oxide film formed between a floating gate and a control gate is constituted by a CVD oxide film formed through chemical vapor-phase growth by a low pressure (LP) CVD method, and there is provided a step of heating the CVD oxide film in a nitriding atmosphere containing any one of $N_2O$, NO and $NH_3$.

Preferably the tunnel oxide film formed between a floating gate and a control gate is constituted by a CVD oxide film formed through chemical vapor-phase growth by a low pressure CVD method and a thermal oxide film grown by a thermal oxidation method, and there is provided the step of heating the CVD oxide film in a nitriding atmosphere containing any one of $N_2O$, NO and $NH_3$ before the formation of the thermal oxide film.

Further, in the step of forming the tunnel oxide film according to the present invention, after a CVD oxide film is formed by a reduced CVD method using a mixture of monosilane ($SiH_4$) and $N^2O$ or a mixture of dichlorsilane ($SiH_2Cl_2$) and $N_2O$ in a low pressure CVD furnace at about 800–900° C., any one of $N_2O$, NO and $NH_3$ is supplied into a diffusion furnace at about 900–1000° C. to heat the CVD oxide film in a nitriding atmosphere containing any one of $N_2O$, NO and $NH_3$.

As a result, when nitrogen atoms are introduced into the boundary portion between the control gate and the tunnel oxide film and inserted into the Si—O bond, the film quality of the tunnel oxide film can be improved so that the trap site can be suppressed. Accordingly, because the occurrence of the trap site is suppressed, the ratio at which electric charges (electrons) flown out from the floating gate at the time of erasing operation are trapped is reduced so that W/E cycle can be improved.

DESCRIPTION OF THE PREFERRED EMBODIMENTS

Embodiment 1

Figure 1:
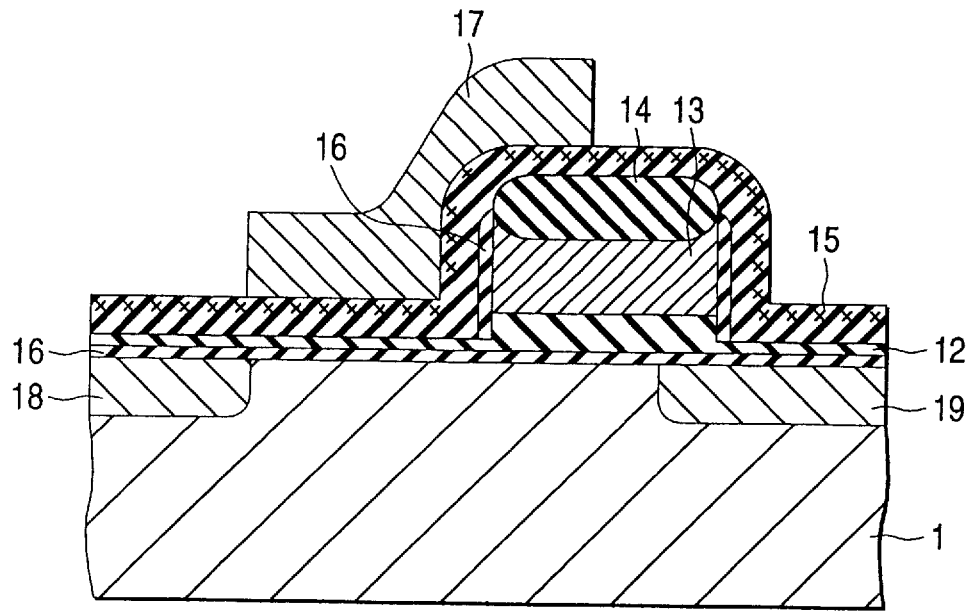
FIG. 1 is a sectional view showing the structure of a memory cell transistor in a nonvolatile semiconductor memory device according to the present invention.

FIG. 1 is a view for explaining the structure of a memory cell transistor in a nonvolatile semiconductor memory device of the first embodiment according-to the present invention.

A first silicon oxide film 12 is formed on a surface of a silicon substrate 1 which is a P-type semiconductor substrate. A floating gate 13 formed from a polycrystalline silicon film is disposed on the first silicon oxide film 12. The first silicon oxide film 12 is a gate insulating film formed by thermal oxidation of a surface of the silicon substrate 1. The silicon oxide film 12 except a portion just under the floating gate 13 is etched away by a little amount by the etching step for forming the floating gate 13, then to be thinner than the portion just under the floating gate 13. A selective oxide film 14 is formed on the floating gate 13 so that the film thickness of the selective oxide film 14 becomes thin at an end portion of the floating gate 13. The selective oxide film 14 is formed by selective oxidation of a surface of a polycrystalline silicon film which serves as the floating gate 13 before formation of the floating gate 13. As a result, the corner portion of the floating gate 13 forms an acute angle, so that electric field concentration occurs easily in the control gate 17 side, as will be described later.

A second silicon oxide film 15 is formed on the silicon substrate 1 having the floating gate 13 formed thereon so that the floating gate 13 and the selective oxide film 14 are coated with the second silicon oxide film 15. The second silicon oxide film 15 is a CVD oxide film formed by a CVD method. The silicon oxide film 15 contains nitrogen atoms.

Further, a third silicon oxide film 16 is formed in a surface of the silicon substrate 1 and in a side wall portion of the floating gate 13. The third silicon oxide film 16 is a thermal oxide film formed by thermal oxidation of the whole surface of the second silicon oxide film 15 after the formation of the second silicon oxide film 15 by the CVD method. Accordingly, a tunnel oxide film formed between the floating gate 13 and the control gate 17 is constituted by a two-layer electrically insulating film which is composed of the second silicon oxide film 15 and the third silicon oxide film 16.

Figure 13:
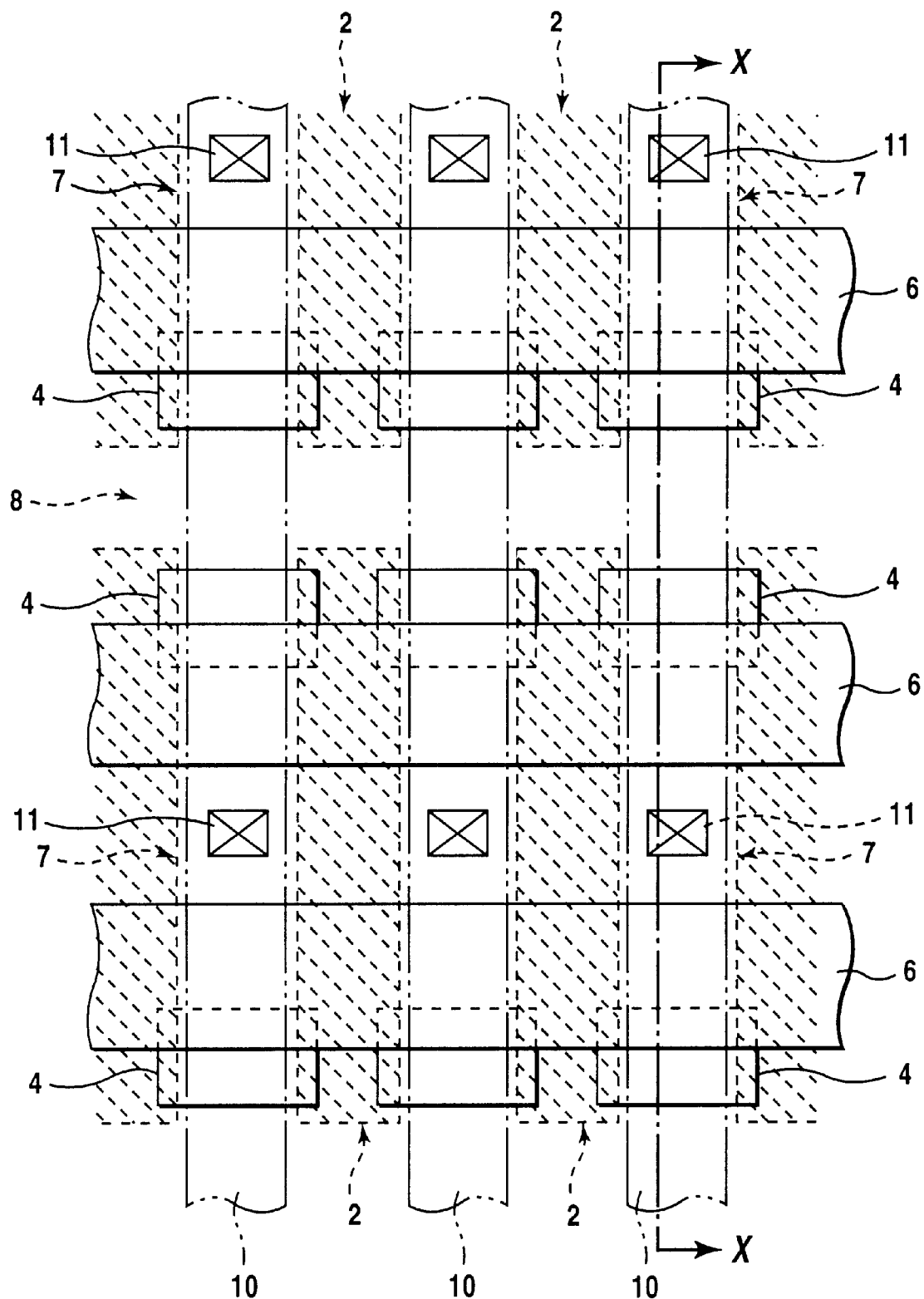
FIG. 13 is a plan view showing the structure of a memory cell in a conventional nonvolatile semiconductor memory device.
Figure 14:
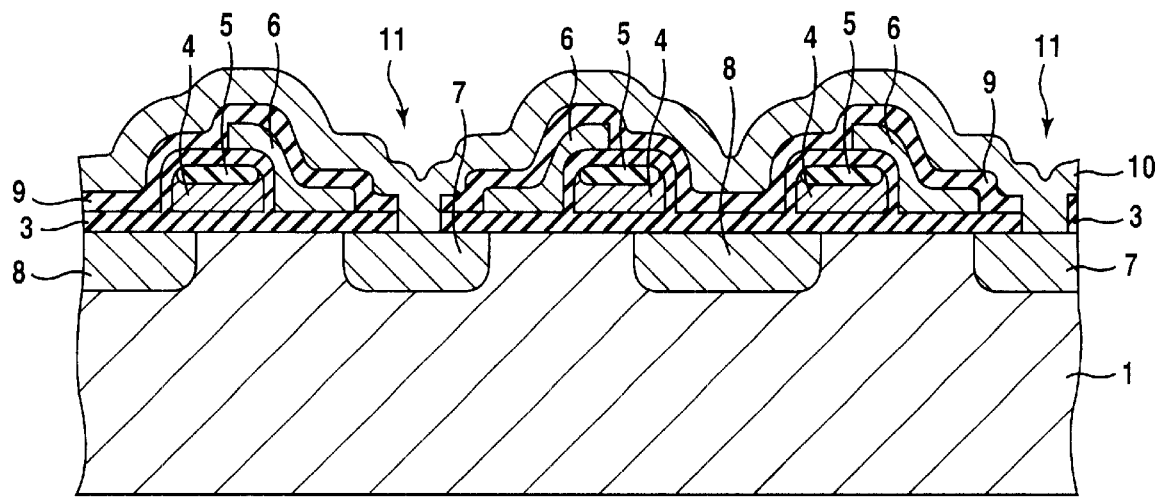
FIG. 14 is a sectional view taken along the line X—X in FIG. 13.
Figure 15:
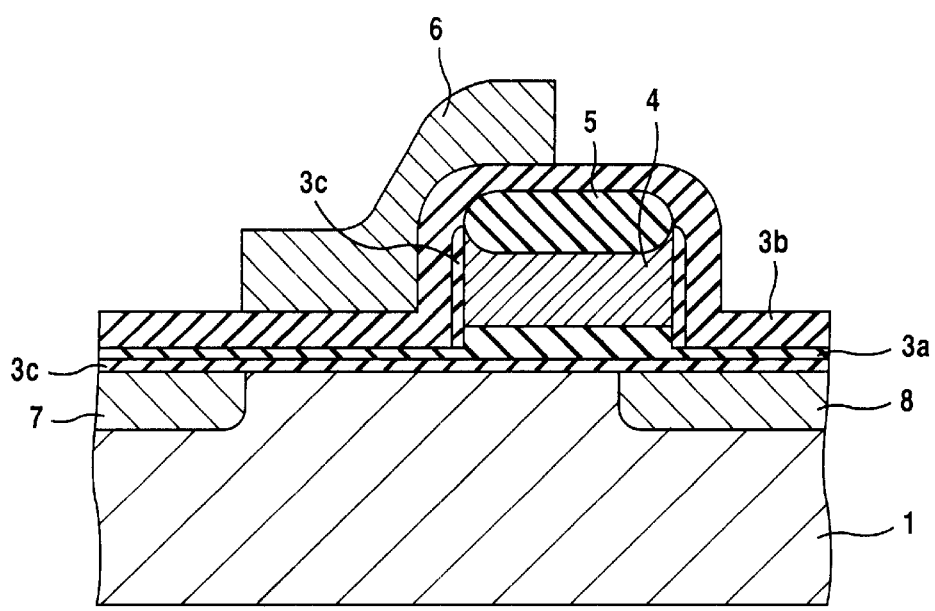
FIG. 15 is a sectional view showing the structure of a memory cell transistor in the conventional nonvolatile semiconductor memory device.

A control gate 17 of a polycrystalline silicon film is formed on the third silicon oxide film 16 as the tunnel oxide film so that the control gate 17 is laid to be spread over the silicon substrate 1 and the floating gate 13. A drain region 18 having N-type impurities diffused is formed in the surface of the silicon substrate 1 adjacent to the control gate 17. Similarly, a source region 19 having N-type impurities diffused is formed in the surface of the silicon substrate 1 adjacent to the floating gate 13. The drain region 18, the source region 19, the floating gate 13 and the control gate 17 form a memory cell transistor. Incidentally, a plurality of memory cell transistors as described above are arranged in the form of a matrix on the silicon substrate 1 in the same manner as in FIG. 13, so that a memory cell array is formed.

For example, data writing/erasing/reading operations in the aforementioned nonvolatile semiconductor memory device are carried out as follows. In the writing operation, the electric potential of the control gate 17 is set to be 2 V, the electric potential of the drain region 18 is set to be 0.5 V, and the electric potential of the source region 19 is set to be 12 V. As a result, hot electrons generated in the vicinity of the drain region 18 are accelerated toward the floating gate 13 side and injected into the floating gate 13 through the first silicon oxide film 12, so that data writing is completed.

On the other hand, in the erasing operation, both the electric potential of the drain region 18 and the electric potential of the source region 19 are selected to be 0 V, and the electric potential of the control gate 17 is selected to be 14 V. As a result, electric charges (electrons) accumulated in the floating gate 13 pass through the tunnel oxide film from the acute angle portion of the corner portion of the floating gate 13 because of FN tunneling. Accordingly, the electric charges (electrons) are released to the control gate 17, so that data erasing operation is completed.

Figure 8:
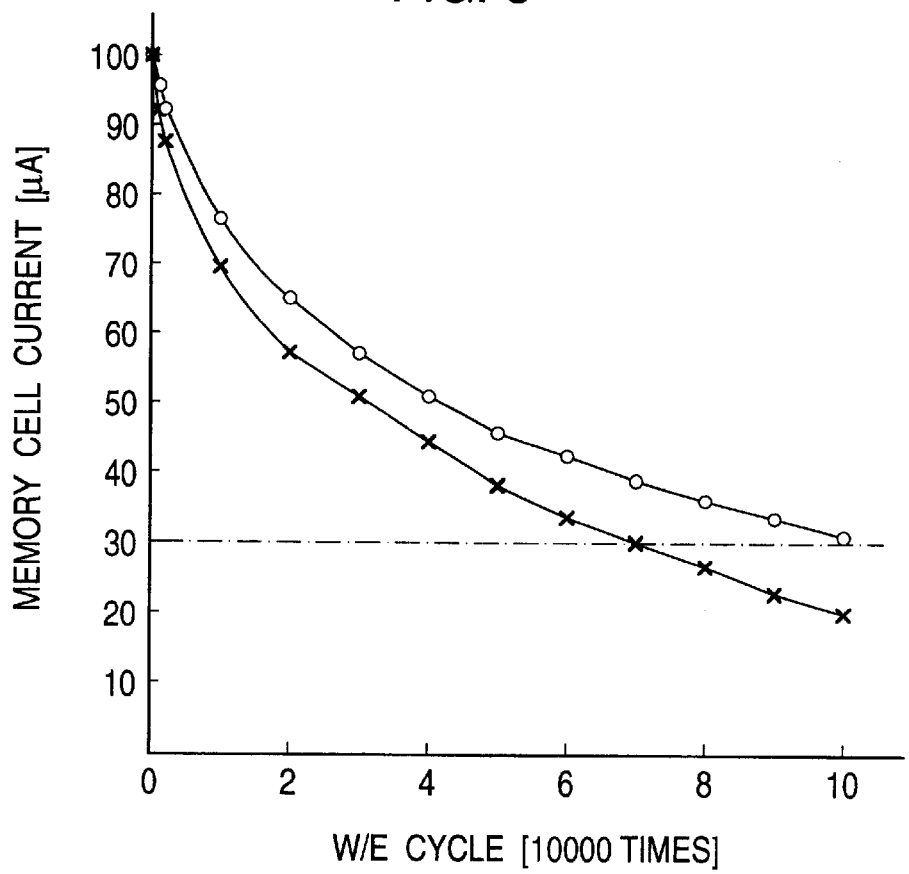
FIG. 8 is a graph for explaining W/E cycle of the nonvolatile semiconductor memory device according to the present invention and W/E cycle of the conventional nonvolatile semiconductor memory device.

In the reading operation, the electric potential of the control gate 17 is set to be 4 V, the electric potential of the drain region 18 is set to be 2 V, and the electric potential of the source region 19 is set to be 0 V. If, in this occasion, electric charges (electrons) are injected into the floating gate 13, the electric potential of the floating gate 13 is reduced so that no channel is formed under the floating gate 13 and no drain current flows. If no electric charge (electron) is injected into the floating gate 13, the electric potential of the floating gate 13 increases so that a channel is formed under the floating gate 13 and a drain current flows. Therefore, when the current flowing out of the drain region 18 is detected by a sense amplifier, the ON/OFF of the memory cell transistor can be judged, that is, written data can be judged. Incidentally, as described above, with respect to a critical point of the ON/OFF judging level in the nonvolatile semiconductor memory device according to this mode and the conventional nonvolatile semiconductor memory device, the point where the memory cell current at the time of erasing operation is reduced to 30 $\mu$A which is equal to 30% of the initial value 100 $\mu$A is assumed to be a critical point of the number of data rewrites by which data rewriting can be repeated, that is, the life of the memory cell transistor, as shown in FIG. 8.

The method for fabricating a nonvolatile semiconductor memory device according to the present invention will be described below.

Figure 2:
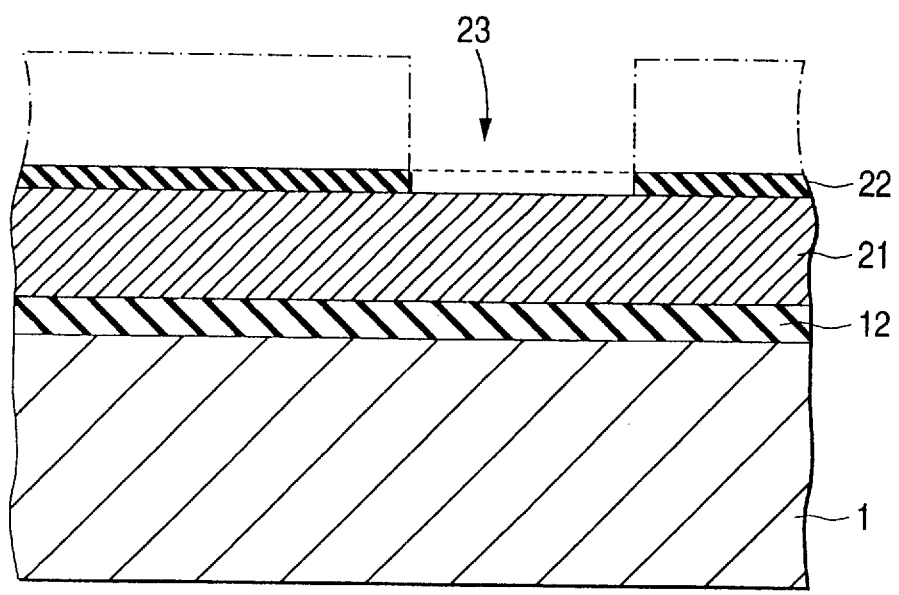
FIG. 2 is a sectional view showing a first step in a method for fabricating a nonvolatile semiconductor memory device according to the present invention.

First Step: FIG. 2

A surface of a P-type silicon substrate 1 is thermally oxidized so that a first silicon oxide film 12 is formed to have a thickness, for example, of 150 A. Further, a polycrystalline silicon film 21 is formed on the first silicon oxide film 12 by a CVD method so that the polycrystalline silicon film 21 has a thickness, for example, of 1700 A. Further, a silicon nitride film 22 which serves as an oxidation resistant film is formed in a surface of the polycrystalline silicon film 21. The silicon nitride film 22 is patterned so that an opening 23 is formed in a position where a floating gate 13 will be formed.

Figure 3:
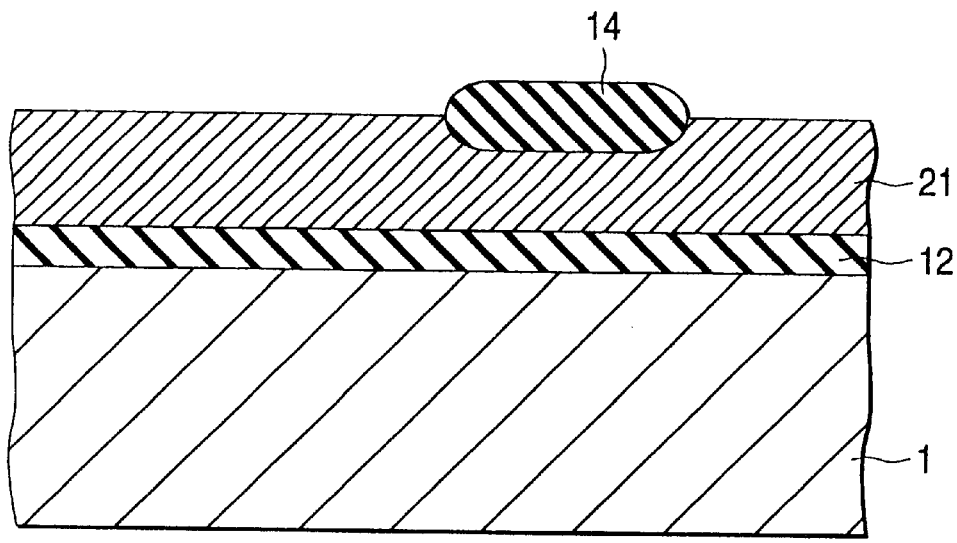
FIG. 3 is a sectional view showing a second step in the method for fabricating a nonvolatile semiconductor memory device according to the present invention.

Second Step: FIG. 3

In the opening 23 portion of the silicon nitride film 22, the surface of the polysilicon film 21 is selectively oxidized to thereby form a selective oxide film 14. Then, the silicon nitride film 22 is removed by etching.

Figure 4:
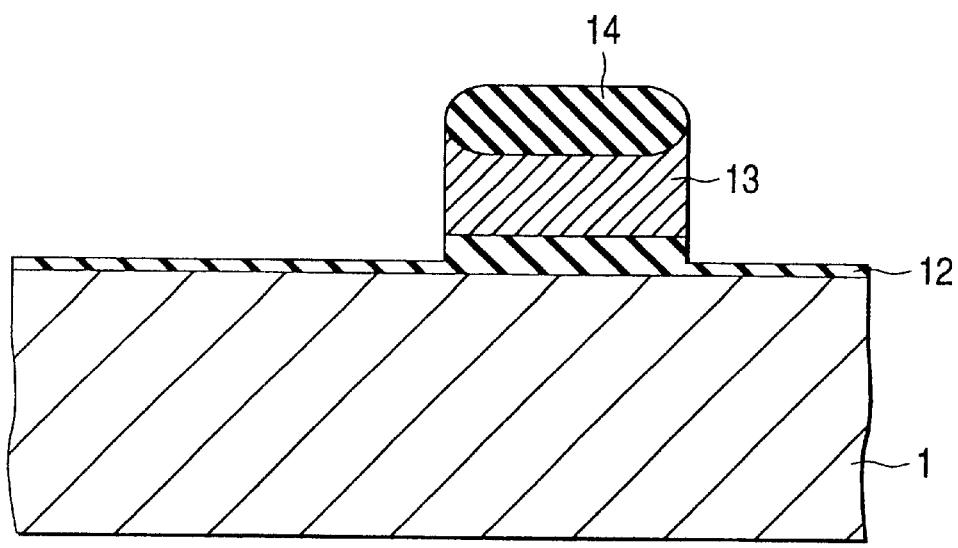
FIG. 4 is a sectional view showing a third step in the method for fabricating a nonvolatile semiconductor memory device according to the present invention.

Third Step: FIG. 4

The polycrystalline silicon film 21 masked with the selective oxide film 14 is etched so that a floating gate 13 having an acute-angle corner portion is formed under the selective oxide film 14. In this occasion, with respect to a portion in which the selective oxide film 14 is not formed, a part of the first silicon oxide film 12 is left to have a thickness, for example, of about 100 A.

Figure 5:
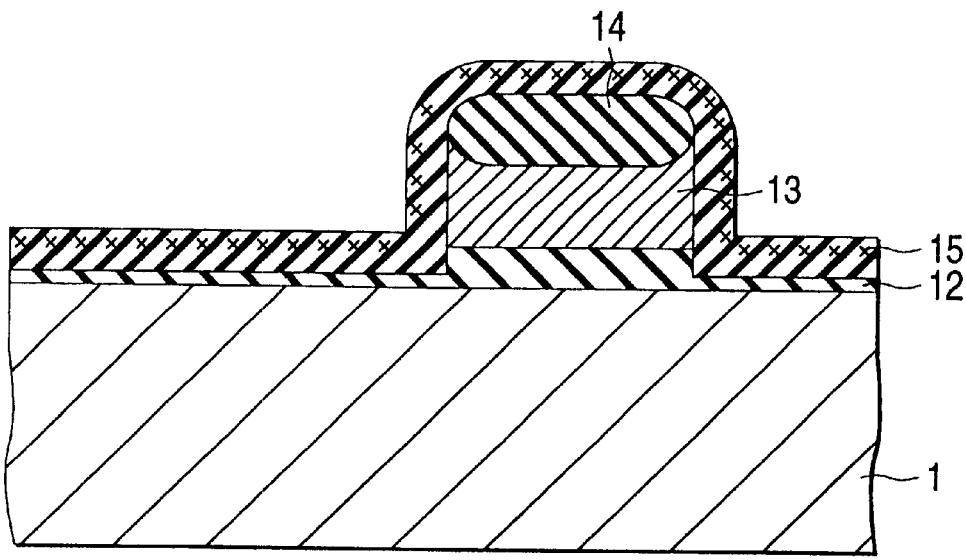
FIG. 5 is a sectional view showing a fourth step in the method for fabricating a nonvolatile semiconductor memory device according to the present invention.

Fourth Step: FIG. 5

A second silicon oxide film 15 is formed on the silicon substrate 1 by a CVD method to have a thickness of about 200 A so that the floating gate 13 and the selective oxide film 14 are covered with the second silicon oxide film 15.

Incidentally, the second silicon oxide film 15 is a CVD oxide film called HTO (high temperature oxide) film formed by a low pressure CVD method under the condition of the vacuum degree of 0.5 to 5 Torr using a mixture of monosilane ($SiH_4$) and $N_2O$ or a mixture of dichlorsilane ($SiH_2Cl_2$) and $N_2O$, for example, at the flow volume ratio of 300 cc:3000 cc in a low pressure CVD furnace at about 800–900° C. (in this mode, 800° C.). It is a matter of course that the CVD oxide film used in the present invention is not limited to the HTO film, but, for example, another CVD oxide film such as TEOS (tetra ethyl ortho silicate) film, or the like, may be used.

Succeedingly, $N_2O$ with flow volume of about 300–3000 cc is supplied into a diffusion furnace at about 900–1000° C.

(in this mode, 950° C.) and $N_2O$ annealing is performed for about 5–10 minutes. As a result, nitrogen atoms (refer to the symbol x in the second silicon oxide film 15 shown in FIG. 5, or the like) are mixed into the second silicon oxide film 15. As a result, the conventional problem (A trap site occurs easily in the boundary portion between the control gate 17 and the second silicon oxide film 15 because of electric charges (electrons) flown out from the floating gate 13 and accelerated by electric field between the control gate and the floating gate to have energy. Because the electric charges (electrons) flown out from the floating gate 13 at the time of erasing operation are trapped in a region of the occurrence of the trap site, erasing efficiency is lowered) can be prevented. That is, when nitrogen atoms are contained in the second silicon oxide film 15 correspondingly to the region of the occurrence of the trap site, free hands of dangling bonds without taking the form of O—Si—O in that region can be terminated by trivalent nitrogen atoms so that dangling bonds can be suppressed. Accordingly, because the occurrence of dangling bonds as electric charge (electron) trap sites is suppressed, the ratio at which electrons flown out from the floating gate at the time of erasing operation are trapped is reduced so that the lowering of erasing efficiency can be suppressed.

Although this mode has shown the case where $N_2O$ annealing is performed for nitriding the second silicon oxide film 15, the invention may be applied to the case where heat treatment is performed in a nitriding atmosphere of, for example, NO, $NH_3$, or the like, as well as $N_2O$.

FIG. 8 is a graph for explaining W/E cycle of the device according to the present invention and that of the conventional device. FIG. 8 shows a state in which the memory cell current (vertical axis) in an erased memory cell decreases as the number of data rewrites (horizontal axis) by which data rewriting can be repeated increases. As shown in FIG. 8, in the nonvolatile semiconductor memory device fabricated through the conventional process, the number of data rewrites by which data rewriting can be repeated before the memory cell current has decreased to reach a critical judgeable level (for example, a memory cell current of 30 $\mu A$) is about 70000. Contrariwise, in the nonvolatile semiconductor memory device fabricated by the process according to the present invention, the number of data rewrites by which data rewriting can be repeated before the cell current has decreased to reach a critical judgeable level is improved to about 100000.

As described above, in the present invention, the second silicon oxide film 15 which is a part of the tunnel oxide film is subjected to heat treatment in a nitriding atmosphere containing $N_2O$, NO, $NH_3$, or the like. As a result, W/E cycle of the device according to the present invention can be improved by about 1.5 times compared with the conventional device.

Figure 6:
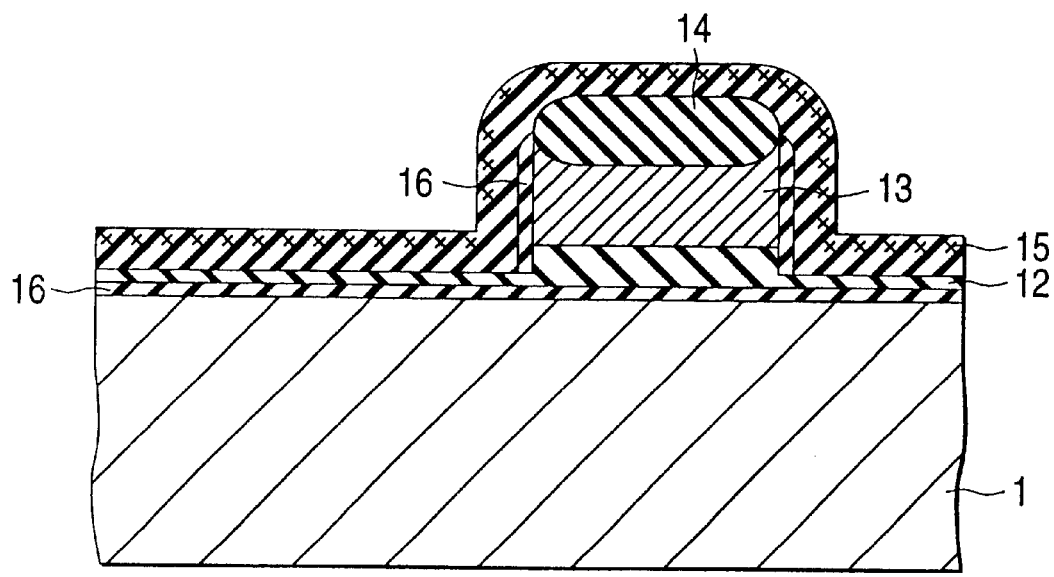
FIG. 6 is a sectional view showing a fifth step in the method for fabricating a nonvolatile semiconductor memory device according to the present invention.

Fifth Step: FIG. 6

The silicon substrate 1 having the second silicon oxide film 15 formed by a CVD method is thermally oxidized in a diffusion furnace to thereby form a third silicon oxide film 16 having a thickness, for example, of 200 A. In the thermal oxidation, a silicon oxide film is grown on the surface of the silicon substrate 1 and the side wall portion of the floating gate 13 through the second silicon oxide film 15. This is owing that the second silicon oxide film 15 formed by a CVD method has a small density.

Figure 7:
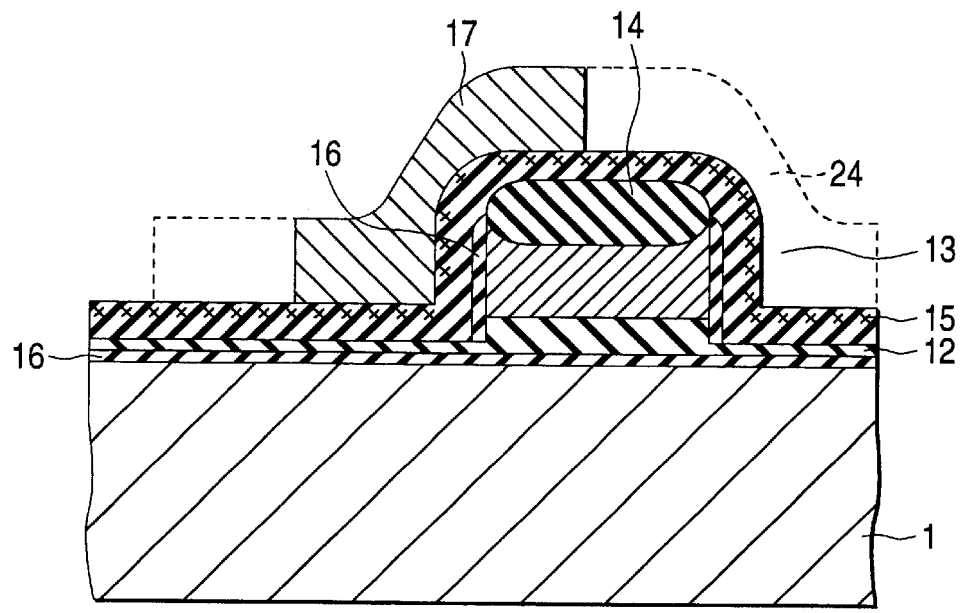
FIG. 7 is a sectional view showing a sixth step in the method for fabricating a nonvolatile semiconductor memory device according to the present invention.

Sixth Step: FIG. 7

A polycrystalline silicon film 24 is formed on the first silicon oxide film 12 and the double-layer structure electrically insulating film so as to have a thickness, for example, of 3000 A. The polycrystalline silicon film 24 is patterned to thereby form a control gate 17 overlapping the floating gate 13. Incidentally, the control gate 17 may be formed as a double-layer structure composed of a polysilicon film and a tungsten silicide ($WSi_x$) film.

Then, N-type impurities such as phosphorus, or the like, are injected into the silicon substrate 1 masked with the floating gate 13 and the control gate 17 in the manner of self alignment to thereby form a drain region 18 and a source region 19 as shown in FIG. 1.

According to the aforementioned fabricating method, as described above, an HTO film serving as a tunnel oxide film is formed by a low pressure CVD method and then continuously subjected to heat treatment in a diffusion furnace in a nitriding atmosphere of $N_2O$, NO, $NH_3$, or the like, so that nitrogen atoms enter the second silicon oxide film 15. Incidentally, as described above, the region of the occurrence of the trap site is present in the boundary portion between the control gate 17 and the second silicon oxide film 15. Dangling bonds without taking the form of O—Si—O occur easily in the region of the occurrence of the trap site. However, when nitrogen atoms are contained in the second silicon oxide film 15 correspondingly to the region of the occurrence of the trap site, free hands of the dangling bonds can be terminated by trivalent nitrogen atoms so that dangling bonds can be suppressed. Accordingly, because the occurrence of dangling bonds serving as the electric charge (electron) trap sites is suppressed, the ratio at which electrons flown out from the floating gate at the time of erasing operation are trapped is reduced. Accordingly, the lowering of erasing efficiency can be suppressed, so that the improvement of W/E cycle is attained.

Incidentally, in this mode, when the second silicon oxide film 15 serving as a tunnel oxide film is formed in a low pressure CVD furnace and then continuously subjected to heat treatment in a diffusion furnace in a nitriding atmosphere of $N_2O$, NO, $NH_3$, or the like, the distribution of nitrogen atoms contained in the tunnel oxide film can be adjusted as follows.

Figure 9:
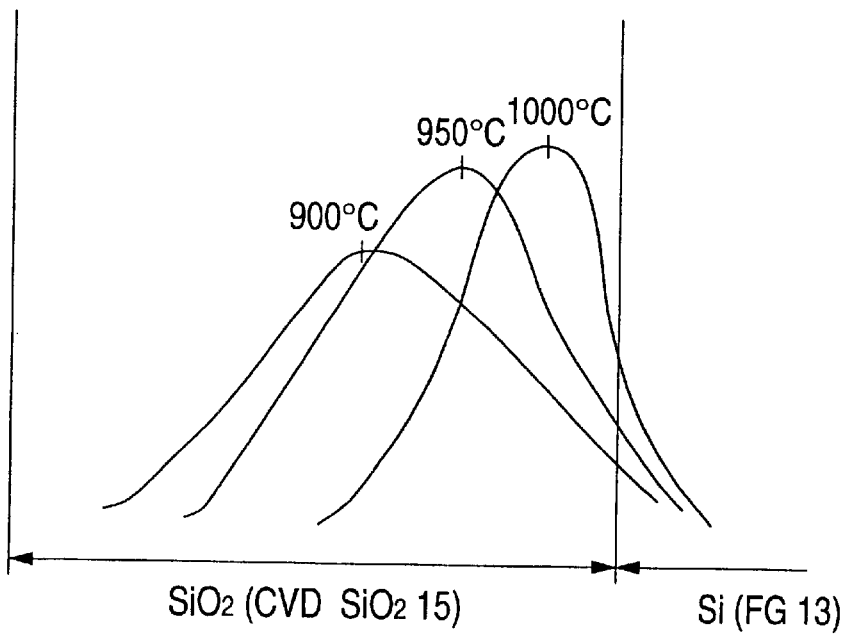
FIG. 9 is a graph showing a nitrogen distribution into the second silicon oxide film according to the present invention.

That is, generally, when nitriding is performed by $N_2O$ annealing, or the like, a peak in the nitrogen distribution is formed in the vicinity of the boundary between $SiO_2$ (second silicon oxide film 15) and Si (floating gate 13) as shown in FIG. 9 (As the treating temperature falls within a range of from 900° C. to 1000° C., the peak in the nitrogen distribution approaches the $SiO_2$ surface side).

Figure 10:
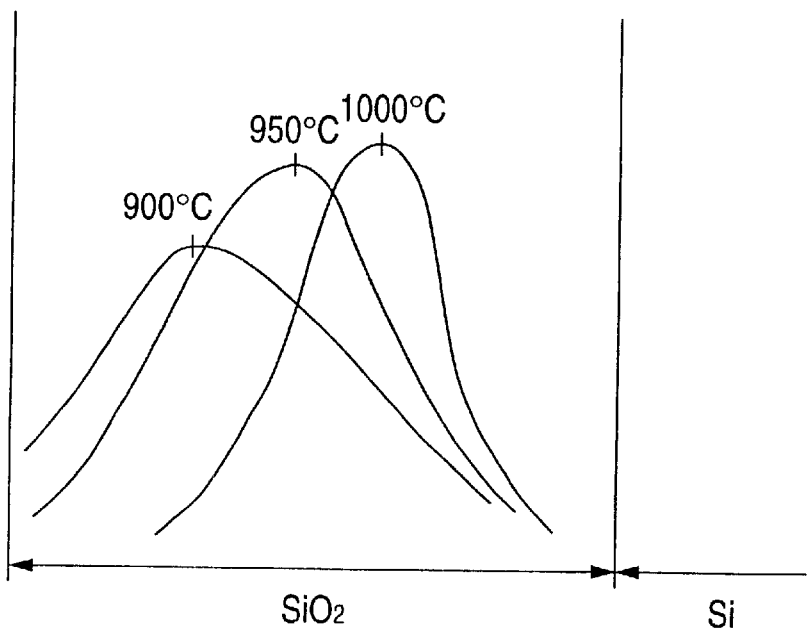
FIG. 10 is a graph showing a nitrogen distribution into the second silicon oxide film according to the present invention.

When re-oxidation is performed by heat treatment for forming the third silicon oxide film 16 in the next step, the peak in the nitrogen distribution shifts to the $SiO_2$ (second silicon oxide film 15) side as shown in FIG. 10. Incidentally, the nitrogen distribution is allowed to be more or less spread while shifting at the time of heating.

From the above description, the aforementioned trap site is apt to be formed in the vicinity of the boundary between the second silicon oxide film 15 and the control gate 17. Accordingly, when the second silicon oxide film 15 is nitrided before the formation of the third silicon oxide film 16 as described in this mode and the peak in the nitrogen distribution is shifted to the surface side of the second silicon oxide film 15 by the heat treatment for forming the third silicon oxide film 16 so that the peak is distributed to the vicinity of the boundary between the second silicon oxide film 15 and the control gate 17, the occurrence of trap sites can be suppressed.

Further, in the present invention, an HTO film and an TEOS film which is a CVD oxide film formed by a reaction of monosilane ($SiH_4$) and $N_2O$ or a reaction of dichlorsilane ($SiH_2Cl_2$) and $N_2O$, is used as the second silicon oxide film which is a part of the tunnel oxide film. Accordingly, a high-quality silicon oxide film can be formed. Particularly in the case where dichlorsilane ($SiH_2Cl_2$) is used, electrical characteristic such as TDDB (time dependent dielectric breakdown) characteristic, or the like, is improved. Furthermore, because the number of H contained in dichlorsilane is smaller than the number of H in monosilane ($SiH_4$), the amount of H contained in the CVD oxide film is reduced. Accordingly, disadvantages (which cause the occurrence of holes to thereby cause insulation breakdown) relevant to the reduction of the amount of H can be reduced. Furthermore, because the film-forming rate becomes low, film thickness controlling characteristic is improved so that variations in a wafer plane and between wafer planes can be suppressed. Furthermore, because the circulation of reaction gas is improved so that the distance between wafers can be reduced, there arises an advantage that the number of wafers allowed to be treated once in batch is about 50 in the case of monosilane ($SiH_4$) whereas the number of wafers allowed to be treated once in batch can be doubled to about 100 in the case of dichlorsilane ($SiH_2Cl_2$).

Embodiment 2

Although the mode of the first embodiment has shown the case where nitridation of the second oxide film 15 is performed by annealing in a diffusion furnace at about 900–1000° C. (in the mode, 950° C.) with supplying $N_2O$, nitridation of the second oxide film 15 may be performed by annealing in a low pressure CVD furnace at about 800–900° C. without rising the temperature of the CVD furnace. Namely after forming the second oxide film 15 like forming the second oxide film 15 in the fourth step of the first embodiment as shown in FIG. 5, nitridation of the second oxide film 15 may be performed as follows.

After forming the second oxide film 15, succeedingly, only $N_2O$ with flow volume of about 3000–5000 cc is supplied into the low pressure CVD furnace and $N_2O$ annealing is performed for about 20–40 minutes. As a result, nitrogen atoms (refer to the symbol x in the second silicon oxide film 15 shown in FIG. 5, or the like) are mixed into the second silicon oxide film 15. As a result, the conventional problem (A trap site occurs easily in the boundary portion between the control gate 17 and the second silicon oxide film 15 because of electric charges (electrons) flown out from the floating gate 13 and accelerated by electric field between the control gate and the floating gate to have energy. Because the electric charges (electrons) flown out from the floating gate 13 at the time of erasing operation are trapped in a region of the occurrence of the trap site, erasing efficiency is lowered) can be prevented. That is, when nitrogen atoms are contained in the second silicon oxide film 15 correspondingly to the region of the occurrence of the trap site, free hands of dangling bonds without taking the form of O—Si—O in that region can be terminated by trivalent nitrogen atoms so that dangling bonds can be suppressed. Accordingly, because the occurrence of dangling bonds to be electric charge (electron) trap sites is suppressed, the ratio at which electrons flown out from the gate at the time of erasing operation are trapped is reduced so that the erasing efficiency can be improved.

Furthermore, because the temperature set in the low pressure CVD furnace for $N_2O$ annealing is selected to be a low temperature of about 800° C. as described above, a larger amount of nitrogen atoms are contained in a region relatively near to a surface of the second silicon oxide film 15. Accordingly, the film quality of the second silicon oxide film 15 in this region becomes high, so that the degradation of the second silicon oxide film 15 caused by the movement of electric charges (electrons) flown out from the corner portion of the floating gate at the time of erasing operation are suppressed. Accordingly, it is effective to attain the elongation of W/E cycle.

Embodiment 3

Figure 11:
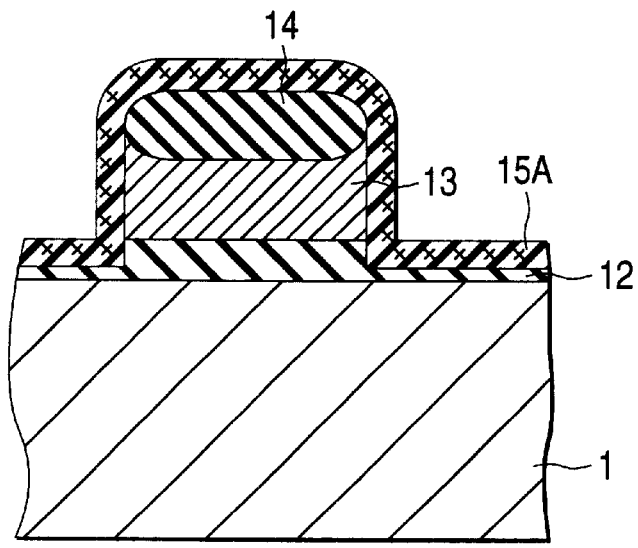
FIG. 11 is a sectional view showing a fourth step in the method for fabricating a nonvolatile semiconductor memory device according to the third embodiment of the present invention.
Figure 12:
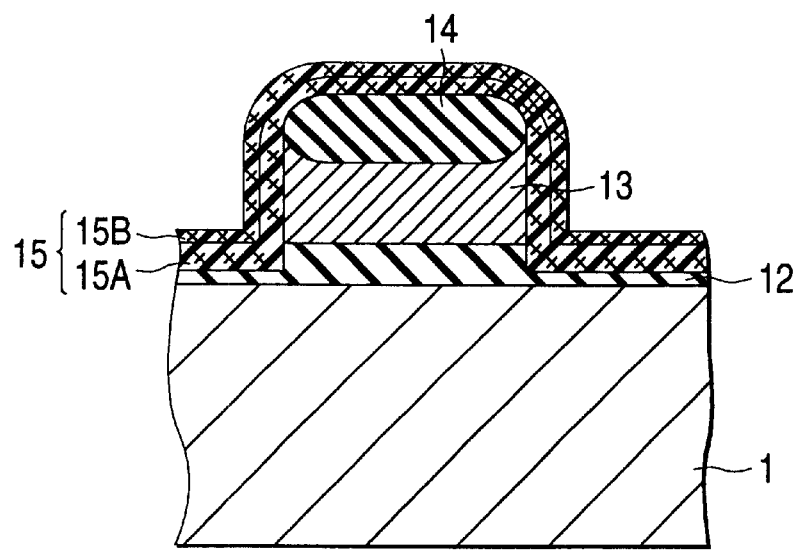
FIG. 12 is a sectional view showing a fourth step in the method for fabricating a nonvolatile semiconductor memory device according to the third embodiment of the present invention.

Although the mode of the first and second embodiment has shown the case where nitridation of the second oxide film 15 is performed after forming the second oxide film 15 as shown in the fourth step shown by FIG. 5, the third embodiment is characterized in that the forming step of the second oxide film 15 covering the floating gate 13 and the selective oxide film 14 is divided into a plurality of steps as shown in FIGS. 11–12. First, as shown in FIG. 11, a first layered-second silicon oxide film 15A is formed on the silicon substrate 1 by a CVD method to have a thickness of about 100 A so that the floating gate 13 and the selective oxide film 14 are covered with the first layered-second silicon oxide film 15A.

Incidentally, the first layered-second silicon oxide film 15a is a CVD oxide film formed by a low pressure CVD method under the condition of the vacuum degree of 0.5 to 5 Torr using a mixture of monosilane ($SiH_4$) and $N_2O$, for example, at the flow volume ratio of 300 cc:3000 cc in a low pressure CVD furnace at about 800–900° C. (in this mode, 800° C.), like the first embodiment.

Succeedingly, $N_2O$ with flow volume of about 300–3000 cc is supplied into a LPCVD furnace at about 800–900° C. (in this mode, 800° C.) and $N_2O$ annealing is performed for about 20–40 minutes. As a result, nitrogen atoms (refer to the symbol x in the first layered-second silicon oxide film 15A shown in FIG. 11, or the like) are mixed into the first layered-second silicon oxide film 15A.

And then a second layered-second silicon oxide film 15B is formed on the first layered-second silicon oxide film 15A by a CVD method to have a thickness of about 100 A under the condition same as that of the formation of the first layered-second silicon oxide film 15A. And $N_2O$ annealing is performed for about 20–40 minutes. As a result, nitrogen atoms (refer to the symbol x in the second layered-second silicon oxide film 15B shown in FIG. 12) are mixed into the second layered-second silicon oxide film 15B.

As described above, according to the third embodiment of the present invention, the formation of the second silicon oxide film and $N_2O$ annealing to the second silicon oxide film are performed in one and the same low pressure CVD furnace. Accordingly, the step of forming the second silicon oxide film and the step of $N_2O$ annealing can be divisionally performed in a plurality of times (in this mode, two times), so that nitrogen atoms can be contained in a desired position in the second silicon oxide film. That is, a portion in which a trap site occurs easily is nitrided so that the lowering of erasing efficiency can be suppressed. Although this mode has shown the case where the step of forming the second silicon oxide film and the step of $N_2O$ annealing are divisionally performed in two times, the invention may be applied to the case where the steps are divisionally performed in a further larger number of times correspondingly to the regions to be nitrided.

According to the present invention, a CVD oxide film as a tunnel oxide film is formed in a low pressure CVD furnace by a low pressure CVD method and then subjected to heat treatment in a LPCVD furnace in a nitriding atmosphere. Accordingly, the CVD oxide film can be nitrided, so that the film quality of the CVD oxide film can be improved. Furthermore, the ratio at which electric charges (electrons) flown out from the floating gate at the time of erasing operation are trapped in the CVD oxide film can be reduced compared with that in the conventional device. Accordingly, the lowering of erasing efficiency is prevented, so that a long-life nonvolatile semiconductor device can be provided.

Further, because the CVD oxide film is formed by a reaction of monosilane ($SiH_4$) and $N_2O$ or a reaction of dichlorsilane ($SiH_2Cl_2$) and $N_2O$, a high-quality CVD oxide film can be formed. Particularly when dichlorsilane ($SiH_2Cl_2$) is used, electrical characteristic such as TDDB characteristic, or the like, is improved. Furthermore, because the number of H contained in dichlorsilane is smaller than the number of H in monosilane ($SiH_4$), the amount of H contained in the CVD oxide film is reduced. Accordingly, disadvantages (which cause the occurrence of holes to thereby cause insulation breakdown) relevant to the reduction of the amount of H can be reduced. Furthermore, because the film-forming rate becomes low, film thickness controlling characteristic is improved so that variations in a wafer plane and between wafer planes can be suppressed.

Although in the first–third embodiment a split gate type of nonvolatile semiconductor memory device is described, a CVD oxide film subjected to heat treatment in a nitriding atmosphere so as to be nitrided, of the present invention is applicable to a tunnel oxide film between a floating gate and a control gate and a tunnel oxide film (gate insulating film) between the floating gate and a semiconductor substrate of a stacked gate type of nonvolatile semiconductor memory device and a tunnel oxide film between the floating gate and the erasing gate of nonvolatile semiconductor memory device further having an exclusive erasing gate. And a gate insulating film using a tunnel oxide of the present invention is also effective.

What is claimed is:

1. A method of fabricating a nonvolatile semiconductor memory device comprising a floating gate formed on a semiconductor substrate of a first conductivity type, a tunnel oxide film formed on said floating gate, a control gate formed on said tunnel oxide film, and a diffused region of a second conductivity type, formed in a surface of said semiconductor substrate adjacent to said floating gate and said control gate, comprising the steps of:

forming a CVD oxide film as said tunnel oxide film through chemical vapor-phase growth by a low pressure CVD method;

performing a heat treatment to said CVD oxide film in a nitriding atmosphere; and growing a thermal oxide film by a thermal oxidation method after performing said heat treatment.

2. The method of fabricating a nonvolatile semiconductor memory device according to claim 1, wherein said forming step is a chemical vapor-phase growth by a low pressure CVD method by one of a reaction of monosilane ($SiH_4$) and $N_2O$ and a reaction of dichlorsilane ($SiH_2Cl_2$) and $N_2O$.

3. The method of fabricating a nonvolatile semiconductor memory device according to claim 1, wherein said heat treatment is performed in a nitriding atmosphere containing at least any one of $N_2O$, NO and $NH_3$.

4. The method of fabricating a nonvolatile semiconductor memory device, comprising the steps of:

forming a gate insulating film on a surface of a semiconductor substrate of a first conductivity type;

forming a floating gate of a first conductive film on said gate insulating film;

forming a CVD oxide film on said semiconductor substrate in a first CVD furnace through chemical vapor-phase growth by a low pressure CVD method so as to cover said floating gate;

nitriding said CVD oxide film;

thermally oxidizing a surface of said semiconductor substrate to form a thermal oxide film in a side wall portion of said floating gate and in said surface of said semiconductor substrate; and forming a control gate of a second conductive film on a tunnel oxide film constituted by said CVD oxide film and said thermal oxide film formed on said floating gate.

5. The method of fabricating a nonvolatile semiconductor memory device, according to claim 4, wherein the step of nitriding comprises the step of continuously nitriding said CVD oxide film in said first CVD furnace successively.

6. The method of fabricating a nonvolatile semiconductor memory device according to claim 4, wherein the step of forming a CVD oxide film comprises the steps of:

forming a predetermined thickness part of said CVD oxide film in a low pressure CVD furnace;

continuously performing a heat treatment in said low pressure CVD furnace in a nitriding atmosphere containing any one of $N_2O$, NO and $NH_3$; and forming the residual film thickness part of said CVD oxide film.

7. The method of fabricating a nonvolatile semiconductor memory device, according to claim 4, wherein the step of nitriding comprises the step of continuously nitriding said CVD oxide film in said first CVD furnace so that free hands of the dangling bonds in the oxide film can be terminated by trivalent nitrogen atoms.

8. A method of fabricating a nonvolatile semiconductor memory device, comprising the steps of:

forming a gate insulating film on a surface of the semiconductor substrate of a first conductivity type;

forming a first conductive film on said gate insulating film;

forming an oxidation resistant film having an opening of a predetermined pattern on said first conductive film;

then selectively oxidizing a surface of said first conductive film in accordance with said opening to form a selective oxide film; and etching said first conductive film except a portion where said selective oxide film is formed to thereby form a floating gate;

forming a CVD oxide film on said semiconductor substrate through chemical vapor-phase growth by a low pressure CVD method so as to cover said floating gate;

annealing nitriding said CVD oxide film in a nitriding atmosphere;

thermally oxidizing a surface of said semiconductor substrate to form a thermal oxide film in a side wall portion of said floating gate and in said surface of said semiconductor substrate; and forming a control gate of a second conductive film on a tunnel oxide film constituted by said CVD oxide film and said thermal oxide film formed on said floating gate by depositing the second conductive film and patterning them so as to be disposed on upper and side wall of the control gate.

9. The method of fabricating a nonvolatile semiconductor memory device according to claim 5, wherein the step of nitriding is conducted at a temperature in a range of 800–900° C.

10. The method of fabricating a nonvolatile semiconductor memory device according to claim 5, wherein the step of nitriding is conducted so that a nitrogen peak is distributed to the vicinity of the boundary between the thermal oxide film and the control gate.

11. The method of fabricating a nonvolatile semiconductor memory device according to claim 4, wherein the steps of nitriding and thermally oxidizing are conducted so that a nitrogen peak is distributed to the vicinity of the boundary between the thermal oxide film and the control gate.

12. The method of fabricating a nonvolatile semiconductor memory device according to claim 4, wherein the step of thermally oxidizing is conducted so that a peak of a nitrogen distribution shifts.

* * * * *

UNITED STATES PATENT AND TRADEMARK OFFICE
CERTIFICATE OF CORRECTION

PATENT NO.     : 6,479,349 B1
DATED          : November 5, 2002
INVENTOR(S)    : Jendick It is certified that error appears in the above-identified patent and that said Letters Patent is hereby corrected as shown below:

<u>Title page</u>,
Item [62], Related U.S. Application Data should read:

-- (62)  Division of application No. 09/412,362, filed on Oct. 5, 1999, which is a continuation of PCT/SE 99/00692, filed on April 28, 1999. --

Signed and Sealed this

Eighth Day of July, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,479,349 B1
DATED         : November 12, 2002
INVENTOR(S)   : Toshiharu Oya et al.

It is certified that error appears in the above-identified patent and that said Letters Patent is hereby corrected as shown below:

This certificate supersedes Certificate of Correction issued July 8, 2003, the number was erroneously mentioned and should be vacated since no Certificate of Correction was granted.

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,476,349 B1 Page 1 of 1
DATED : November 5, 2002
INVENTOR(S) : Jendick It is certified that error appears in the above-identified patent and that said Letters Patent is hereby corrected as shown below:

<u>Title page,</u>
Item [62], Related U.S. Application Data should read:

-- [62] Division of application No. 09/412,362, filed on Oct. 5, 1999, which is a continuation of PCT/SE99/00692, filed on April 28, 1999. --

Signed and Sealed this

Twenty-eighth Day of June, 2005

JON W. DUDAS
*Acting Director of the United States Patent and Trademark Office*